(12) United States Patent
Nonaka

(10) Patent No.: US 10,418,258 B2
(45) Date of Patent: Sep. 17, 2019

(54) MOUNTING TABLE TEMPERATURE CONTROL DEVICE AND SUBSTRATE PROCESSING APPARATUS

(75) Inventor: Ryo Nonaka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1406 days.

(21) Appl. No.: 14/233,247

(22) PCT Filed: Jul. 19, 2012

(86) PCT No.: PCT/JP2012/068280
§ 371 (c)(1),
(2), (4) Date: Apr. 10, 2014

(87) PCT Pub. No.: WO2013/012025
PCT Pub. Date: Jan. 24, 2013

(65) Prior Publication Data
US 2014/0311728 A1 Oct. 23, 2014

Related U.S. Application Data

(60) Provisional application No. 61/523,889, filed on Aug. 16, 2011.

(30) Foreign Application Priority Data

Jul. 20, 2011 (JP) .................... 2011-158950

(51) Int. Cl.
*H01L 21/67* (2006.01)

(52) U.S. Cl.
CPC .. *H01L 21/67103* (2013.01); *H01L 21/67098* (2013.01); *H01L 21/67109* (2013.01); *H01L 21/67248* (2013.01)

(58) Field of Classification Search
CPC ......... H01L 21/67103; H01L 21/67098; H01L 21/67109; H01L 21/67248; C23C 14/50;
(Continued)

(56) References Cited

U.S. PATENT DOCUMENTS 5,846,375 A * 12/1998 Gilchrist ........... H01J 37/32724
118/723 E
2004/0097088 A1 * 5/2004 Kitayama ............... C30B 31/14
438/694
2006/0219360 A1 * 10/2006 Iwasaki .............. G05D 23/1902
156/345.27

FOREIGN PATENT DOCUMENTS

JP 2002-217178 A 8/2002
JP 2006-286733 A 10/2006
JP 2008-187063 A 8/2008

OTHER PUBLICATIONS

International Search Report for PCT/JP2012/068280 dated Oct. 2, 2012.

* cited by examiner

*Primary Examiner* — Gordon Baldwin
*Assistant Examiner* — Mirza Israr Javed
(74) *Attorney, Agent, or Firm* — Pearne & Gordon LLP

(57) ABSTRACT

A temperature of only a part in a surface of a mounting table can be set to be higher than or lower than a set temperature of an entire surface of the mounting table. A main flow path 320 formed within the mounting table 200 to be arranged over the entire surface thereof; an auxiliary flow path 330 formed within the mounting table to be arranged in a part of the surface thereof; and a temperature control medium circulating unit that supplies and circulates a temperature control medium adjusted to have a set temperature into and through the main flow path, allows the temperature control medium to be branched, and supplies and circulates the (Continued)

branched temperature control medium into and through the auxiliary flow path after adjusting a temperature of the branched temperature control medium to be a temperature higher than or lower than the set temperature are provided.

5 Claims, 4 Drawing Sheets

(58) Field of Classification Search
CPC . C23C 14/505; C23C 14/541; C23C 16/4583; C23C 16/4586; C23C 16/463; H01J 37/32697–32724
See application file for complete search history.

MOUNTING TABLE TEMPERATURE CONTROL DEVICE AND SUBSTRATE PROCESSING APPARATUS

CROSS-REFERENCE TO RELATED APPLICATION

This Application is a U.S. national phase application under 35 U.S.C. § 371 of PCT Application No. PCT/JP2012/068280 filed on Jul. 19, 2012, which claims the benefit of Japanese Patent Application No. 2011-158950 filed on Jul. 20, 2011, and U.S. Provisional Application Ser. No. 61/523,889 filed on Aug. 16, 2011, the entire disclosures of which are incorporated herein by reference

TECHNICAL FIELD

The embodiments described herein pertain generally to a substrate processing apparatus and a mounting table temperature control device configured to control a temperature of a mounting table for mounting thereon a processing target substrate such as a semiconductor wafer, a solar cell substrate, or a liquid crystal substrate.

BACKGROUND ART

In order to perform microprocessing such as etching process or film forming process on a processing target substrate such as a semiconductor substrate, a solar cell substrate or a liquid crystal substrate, there is known a substrate processing apparatus configured to mount the processing target substrate on a mounting table, supply a processing gas onto the processing target substrate and perform a required process on the processing target substrate by plasma excited from the processing gas.

In such a substrate processing apparatus, a temperature in a surface of the mounting table is controlled in order to control processing uniformity in a surface of the substrate. For example, widely employed is a method of forming, within the mounting table, a coolant path or passage through which a coolant is flown. In this method, a temperature-controlled coolant is supplied into and circulated through the coolant path from a chiller device.

Recently, as a processing dimension in a plasma process is miniaturized and the plasma process is diversified, techniques to conduct a temperature distribution control of the mounting table are also diversified. For example, Patent Document 1 describes a configuration where an upper heat medium path and a lower heat medium path are formed in the entire surface of a mounting table. A cooling medium and a heating medium are selectively supplied into corresponding one of these heat medium paths as a heat medium. In this configuration, a temperature of the mounting table can be controlled to be a high temperature or a low temperature in both ways.

Further, described in Patent Document 2 is a configuration where a coolant path is divided in two parts corresponding to a central portion and a peripheral portion of a mounting table, respectively. In this configuration, by switching lines through which a coolant from a chiller unit is circulated, the coolant is controlled to be circulated in the central portion or in the peripheral portion of the mounting table, thus controlling temperatures of the central portion and the peripheral portion of the mounting table.

REFERENCES

Patent Document 1: Japanese Patent Laid-open Publication No. 2002-217178

Patent Document 2: Japanese Patent Laid-open Publication No. 2006-286733

DISCLOSURE OF THE INVENTION

Problems to be Solved by the Invention

However, in the conventional temperature distribution control of the mounting tables as described in Patent Documents 1 and 2, it is difficult to locally set a temperature of only a desired portion in the surface of the mounting table to be higher than or lower than a set temperature of the entire mounting table. For example, in Patent Document 1, since different heat mediums are supplied into the upper and lower heat medium paths independently, it is difficult to change a set temperature of only a certain portion in the surface of the mounting table with respect to the set temperature of the entire mounting table. Further, in Patent Document 2, although it is possible to control a temperature of one of the central portion and the peripheral portion in the surface of the mounting table with respect to a temperature of the other, it is still difficult to change a set temperature of only a certain portion in the surface of the mounting table with respect to the set temperature of the entire mounting table.

Further, there may be employed a method of controlling heat conductivity by setting a pressure of a heat transfer gas (e.g., a He gas) supplied into a gap between a mounting table and a substrate to be different at a central portion and a peripheral portion of the mounting table. According to this method, a temperature increase caused by heat applied from plasma is controlled, and it is possible to control a temperature in the surfaces of a central portion and a peripheral portion of the mounting table.

In this controlling the temperature in the surface of the mounting table, however, when a power level of a high frequency power for plasma generation is low, it may be difficult to generate a temperature difference between the central portion and the peripheral portion of the mounting table even if the pressure of the heat transfer gas is adjusted.

In view of the foregoing problems, example embodiments provide a substrate processing apparatus and a mounting table temperature control device configured to locally increase or decrease a temperature of only a desired portion in a surface of a mounting table with respect to a set temperature of the entire surface of the mounting table by controlling a temperature of a temperature control medium.

Means for Solving the Problems

In one example embodiment, a mounting table temperature control device that controls a temperature of a mounting table includes a main flow path formed within the mounting table to be arranged over an entire surface thereof; at least one auxiliary flow path formed within the mounting table to be arranged in a part of the surface of the mounting table; and a temperature control medium circulating unit configured to supply and circulate a temperature control medium adjusted to have a set temperature into and through the main flow path, allow the temperature control medium to be branched, and supply and circulate the branched temperature control medium into and through the at least one auxiliary flow path after adjusting a temperature of the branched temperature control medium to a temperature higher than or lower than the set temperature.

In another example embodiment, a substrate processing apparatus that performs a preset process on a substrate mounted on a mounting table includes a mounting table temperature control device configured to control a temperature of the mounting table. Further, the mounting table temperature control device includes a main flow path formed within the mounting table to be arranged over an entire surface thereof; an auxiliary flow path formed within the mounting table to be arranged in a part of the surface of the mounting table; and a temperature control medium circulating unit configured to supply and circulate a temperature control medium adjusted to have a set temperature into and through the main flow path, allow the temperature control medium to be branched, and supply and circulate the branched temperature control medium into and through the auxiliary flow path after adjusting a temperature of the branched temperature control medium to a temperature higher than or lower than the set temperature.

In these configurations, it is possible to adjust a temperature of the entire surface of the mounting table to a preset temperature by supplying the temperature control medium adjusted to have a set temperature into the main flow path. Further, by allowing the temperature control medium to be branched, adjusting a temperature thereof, and then supplying the temperature control medium into the auxiliary flow path, it is possible to locally set a temperature of a portion of the mounting table where the auxiliary flow path is formed to be higher than or lower than the set temperature. As a result, for example, by forming the auxiliary flow path at a portion where a temperature in the surface of the mounting table is to be adjusted to be higher than or lower than the set temperature, it is possible to locally adjust a temperature of the portion to be higher than or lower than the set temperature. In the present embodiment, the temperature of the temperature control medium is controlled, not a pressure of a heat transfer gas. Thus, even if a power level of a high frequency power for plasma generation is low, it is possible to generate a sufficient difference between a temperature of the portion of the mounting table where the auxiliary flow path is formed and a set temperature of an entire mounting table.

The Temperature control medium circulating unit may include a temperature control medium circulator, having a discharge opening and a return opening for the temperature control medium, configured to discharge the temperature control medium through the discharge opening after adjusting a temperature of the temperature control medium to the set temperature and discharge again the temperature control medium returned back to the return opening after adjusting a temperature of the returned temperature control medium to the set temperature; a main supply line configured to supply the temperature control medium discharged from the temperature control medium circulator into the main flow path; an auxiliary supply line branched from the main supply line and configured to supply the temperature control medium into the at least one auxiliary flow path; and an auxiliary temperature controller that is provided at the auxiliary supply line and is configured to adjust a temperature of the temperature control medium branched into the auxiliary supply line to a temperature higher than or lower than the set temperature before the branched temperature control medium is supplied into the at least one auxiliary flow path. Further, the at least one auxiliary flow path may be formed either in a part of a central portion of the mounting table or in a part of a peripheral portion of the mounting table.

The at least one auxiliary flow path is plural in number. The auxiliary flow paths may be formed in each of a part of a central portion of the mounting table and a part of a peripheral portion of the mounting table. Further, the temperature control medium circulating unit may include a temperature control medium circulator, having a discharge opening and a return opening for the temperature control medium, configured to discharge the temperature control medium through the discharge opening after adjusting a temperature of the temperature control medium to be the set temperature and discharge again the temperature control medium returned back to the return opening after adjusting a temperature of the returned temperature control medium to be the set temperature; a main supply line configured to supply the temperature control medium discharged from the temperature control medium circulator into the main flow path; a first auxiliary supply line and a second auxiliary supply line branched from the main supply line; a switching unit configured to connect the first auxiliary supply line and the second auxiliary supply line to the auxiliary flow paths, respectively, and supply the temperature control medium from the first auxiliary supply line and the temperature control medium from the second auxiliary supply line into the auxiliary flow paths, respectively, while selectively switching the temperature control medium from the first auxiliary supply line and the temperature control medium from the second auxiliary supply line; and an auxiliary temperature controller that is provided at either one or each of the first auxiliary supply line and the second auxiliary supply line, and is configured to adjust a temperature of the temperature control medium to be a temperature higher than or lower than the set temperature before the temperature control medium is supplied into each auxiliary flow path.

A cross sectional area of the at least one auxiliary flow path may be set to be smaller than a cross sectional area of the main flow path, and a cross sectional area of the auxiliary supply line may be set to be smaller than a cross sectional are of the main supply line. In this case, a pump may be provided at the auxiliary supply line.

Effect of the Invention

In accordance with an example embodiment, it is possible to set a temperature of only a required portion in a surface of a mounting table to be higher than or lower than a set temperature of the entire surface of the mounting table.

DETAILED DESCRIPTION

Figure 1:
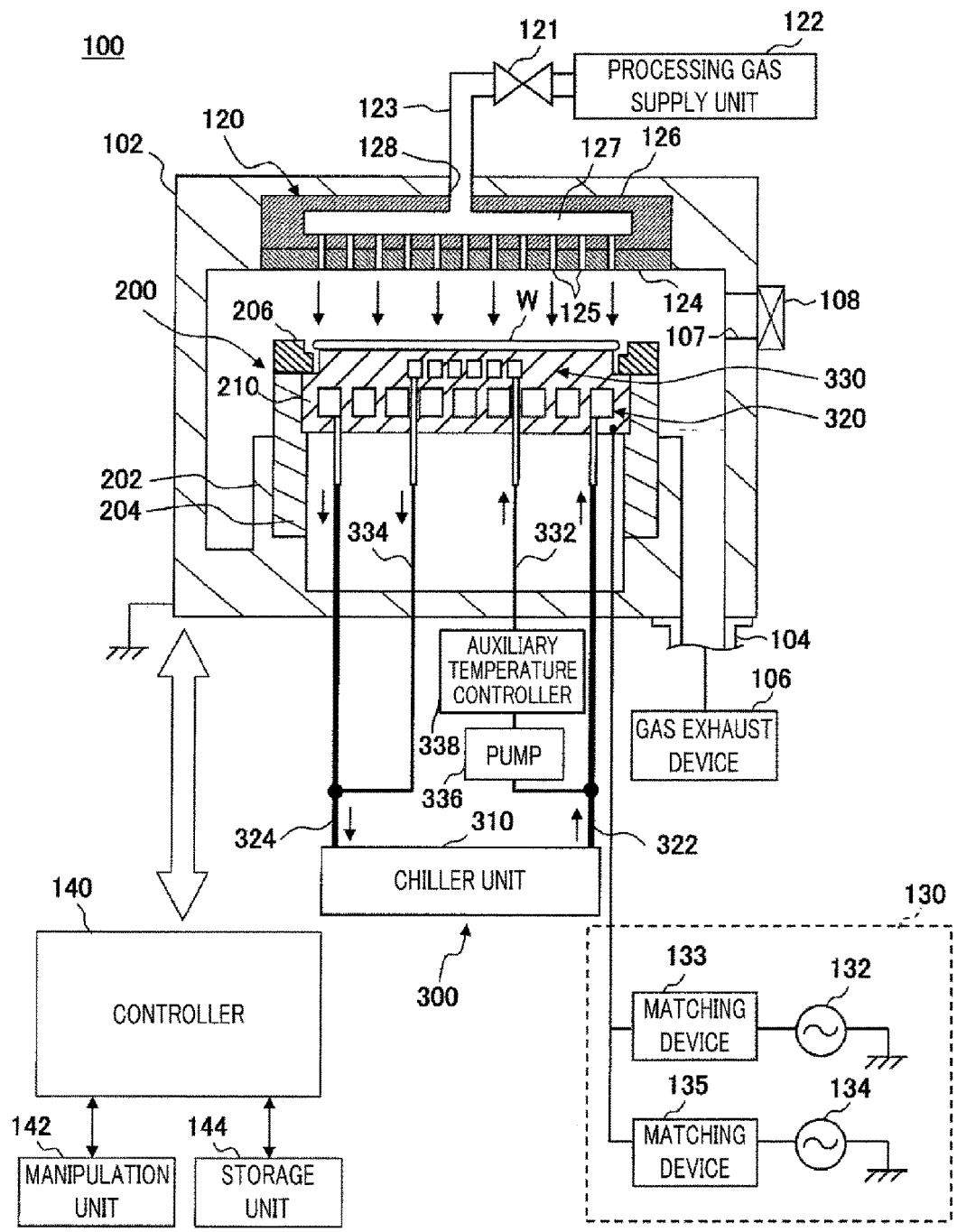
FIG. 1 is a cross sectional view illustrating a configuration example of a substrate processing apparatus in accordance with an example embodiment.

In the following, example embodiments will be described, and reference is made to the accompanying drawings, which form a part of the description. In the specification and the drawings, like parts having substantially the same function and configuration will be assigned like reference numerals, and redundant description will be omitted.

(Substrate Processing Apparatus)

First, a configuration example of a substrate processing apparatus in accordance with an example embodiment will be described with reference to the accompanying drawings. Here, the substrate processing apparatus is configured to apply dual high frequency powers of different frequencies to a single electrode (lower electrode). FIG. 1 is a cross sectional view illustrating a schematic configuration of the substrate processing apparatus in accordance with the present example embodiment.

The substrate processing apparatus 100 shown in FIG. 1 includes a processing chamber (chamber) 102 having a cylindrical processing vessel made of a metal such as, but not limited to, stainless steel or aluminum having an anodically oxidized (alumite-treated) surface. The processing chamber 102 is grounded. Provided in the processing chamber 102 is a substantially circular plate-shaped substrate mounting table (hereinafter, simply referred to as a "mounting table") 200 configured to mount thereon a substrate such as a semiconductor wafer (hereinafter, simply referred to as a "wafer") W. The mounting table 200 includes a susceptor 210 which is configured to mount thereon the wafer W and serve as a lower electrode. An upper electrode 120 also serving as a shower head configured to introduce a processing gas, a purge gas, or the like is disposed above the susceptor 210 to face the susceptor 210.

The upper electrode 120 is provided at a ceiling portion of the processing chamber 102 and is grounded. A processing gas supply unit 122 configured to supply a processing gas is connected to the upper electrode 120 via a processing gas supply line 123. The processing gas supply line 123 is equipped with an opening/closing valve 121 configured to turn on and off a supply of the processing gas from the processing gas supply unit 122.

The processing gas supply unit 122 may include a single gas supply source or a multiple number of gas supply sources. When the processing gas supply unit 123 has a single gas supply source, a gas line of this gas supply source is directly connected to the processing gas supply line 123. When the processing gas supply unit 123 has a multiple number of gas supply sources, gas lines of the respective gas supply sources are connected to the processing gas supply line 123 such that gases from the respective gas supply sources are mixed with each other. The gas line of each gas supply source is equipped with an opening/closing valve configured to turn on and off a supply of each gas and a mass flow controller configured to control a flow rate of each gas.

In this processing gas supply unit 122, a gas from the single or the multiple number of gas supply sources is introduced into the processing gas supply line 123 as a processing gas at a preset flow rate or at a preset flow rate ratio. Further, a gas supply source required depending on process kinds of the wafer W is provided in the processing gas supply unit 122. That is, when performing an etching process on the wafer W, an etching gas supply source is provided therein, and when performing a film forming process on the wafer W, a film forming gas supply source is provided therein. By way of non-limiting example, a fluorocarbon (CF)-based fluorine compound represented by $C_xF_y$ such as $CF_4$, $C_4F_6$, $C_4F_8$ or $C_5F_8$ may be used as the etching gas. Further, by way of non-limiting example, an $O_2$ gas or a rare gas as a carrier gas (e.g., an Ar gas) may be used as a gas for controlling a deposit of a CF-based reaction product.

The upper electrode 120 includes an electrode plate 124 and an electrode supporting member 126. The electrode plate 124 has a multiple number of gas holes 125 and serves as a bottom surface of the upper electrode 120. The electrode supporting member 126 is configured to support the electrode plate 124 in a detachable manner. A buffer room 127 is formed within the electrode supporting member 126. The processing gas supply line 123 of the processing gas supply unit 122 is connected to a gas inlet opening 128 of the buffer room 127. With this configuration, a gas from the processing gas supply unit 122 is diffused in the buffer room after introduced from the gas inlet opening 128, and then, discharged toward the wafer W mounted on the mounting table 200 through the respective gas holes 125.

The susceptor 210 forming the mounting table 200 is made of, but not limited to, aluminum. The susceptor 210 is held by a cylindrical member 202 vertically extended upward from a bottom of the processing chamber 102 via an insulating cylindrical holding member 204. A focus ring 206 is provided on the cylindrical holding member 204 to surround the wafer W mounted on the susceptor 210. The focus ring 206 is made of, but not limited to, quartz or silicon.

An electrostatic chuck (not shown) configured to hold the wafer W by an electrostatic attracting force is provided on a top surface of the susceptor 210. The electrostatic chuck has therein a plate-shaped electrode. By applying a DC voltage to this electrode, the electrostatic chuck attracts and holds the wafer W thereon. Further, in order to accelerate a heat transfer between the electrostatic chuck and the wafer W, a heat transfer gas supply device (not shown) configured to supply a heat transfer gas such as a He gas toward a gap between the electrostatic chuck and the wafer W is provided at the susceptor 210.

The susceptor 210 includes a temperature control device 300 configured to adjust a temperature of the wafer W. The temperature control device 300 adjusts a temperature of the susceptor 210 by circulating a temperature control medium, which is adjusted to have a preset temperature by the chiller unit 310, through the inside of the susceptor 210. The temperature control device 300 is configured to locally adjust a temperature of a certain portion in a surface of the susceptor 210 to a temperature higher than or lower than a set temperature of the entire susceptor 210. A detailed configuration example of this temperature control device 300 will be elaborated later.

A power supply device 130 configured to supply dual-frequency powers is connected to the susceptor 210 serving as the lower electrode. The power supply device 130 includes a first high frequency power supply 132 configured to supply a first high frequency power of a first frequency (i.e., a high frequency power for plasma generation); and a second high frequency power supply 134 configured to supply a second high frequency power (i.e., a high frequency power for bias voltage generation) of a second frequency lower than the first frequency. The first high frequency power supply 132 and the second high frequency power supply 134 are electrically connected to the susceptor 210 via a first matching device 133 and a second matching device 135, respectively.

The first matching device 133 and the second matching device 135 are configured to match a load impedance with internal (or output) impedances of the first high frequency power supply 132 and the second high frequency power supply 134, respectively. The first matching device 133 and the second matching device 135 can control the internal impedances of the first high frequency power supply 132 and the second high frequency power supply 134 to be apparently matched with the load impedance when plasma is generated within the processing chamber 102.

The first high frequency power supply 132 is configured to output a high frequency power of a frequency equal to or higher than about 27 MHz (e.g., about 40 MHz). The second high frequency power supply 134 is configured to output a high frequency power of a frequency equal to or lower than about 13.56 MHz (e.g., about 2 MHz).

A gas exhaust opening 104 is formed in a bottom surface of the processing chamber 102. By exhausting an atmosphere within the processing chamber 102 by a gas exhaust device 106 connected to the gas exhaust opening 104, the inside of the processing chamber 102 can be maintained at a certain vacuum level. A loading/unloading opening 107, through which a wafer W is loaded or unloaded, is formed in a sidewall of the processing chamber 102, and the loading/unloading opening 107 is opened or closed by a gate valve 108. After the gate valve 108 is opened, the wafer W is loaded into or unloaded from the processing chamber 102 by a non-illustrated transfer arm or the like.

The substrate processing apparatus 100 includes a controller 140 configured to control overall operations of the apparatus. Connected to the controller 140 is a manipulation unit 142 which includes a keyboard through which an operator inputs a command to manage the substrate processing apparatus 100, a display that visually displays an operational status of the substrate processing apparatus 100, and so forth.

Also connected to the controller 140 is a storage unit 144 that stores programs for implementing various processes in the substrate processing apparatus 100 under the control of the controller 140, processing conditions (recipes) necessary to execute the programs, and so forth.

By way of non-limiting example, a first and a second processing conditions (recipes) to be described later is stored in the storage unit 144. Each processing condition is a set of a multiple number of parameter values such control parameters for controlling individual components of the substrate processing apparatus 100, setup parameters, and so forth. Each processing condition includes, by way of non-limiting example, parameter values such as a flow rate ratio of processing gases, a pressure within the processing chamber, and a high frequency power.

Further, these programs or processing conditions may be stored on a hard disk or a semiconductor memory, or may be set at a preset position of the storage unit 144 while being recorded on a computer-readable portable storage medium such as a CD-ROM, a DVD, etc.

The controller 140 reads out a required program or processing condition from the storage unit 144 in response to, e.g., an instruction from the manipulation unit 142 and controls each component of the substrate processing apparatus 100, so that a required process can be performed on the substrate processing apparatus 100. Further, it is possible to edit the processing condition through the manipulation unit 142.

(Temperature Control Device of Mounting Table)

Figure 2:
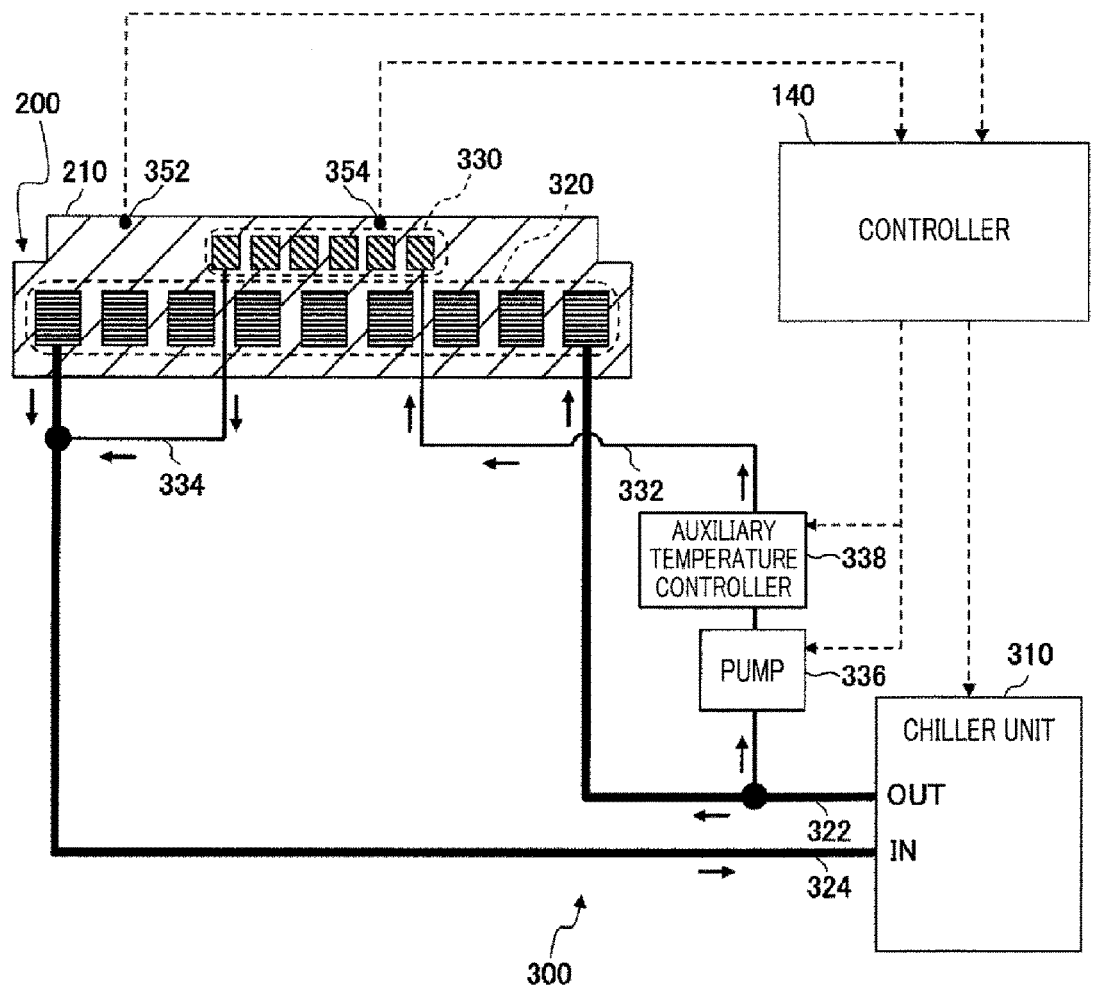
FIG. 2 is a diagram for describing a configuration of a temperature control device of a mounting table shown in FIG. 1.

Now, a detailed configuration example of the temperature control device 300 in accordance with the present example embodiment will be explained with reference to the accompanying drawings. FIG. 2 illustrates the detailed configuration example of the temperature control device 300 shown in FIG. 1. The temperature control device 300 illustrated in FIG. 2 includes a temperature control medium circulating unit configured to circulate a temperature control medium through a single-system main flow path 320 and a single-system auxiliary flow path 330. The main flow path 320 is formed within the susceptor 210 of the mounting table 200 to be arranged over the entire surface of the susceptor 210, i.e., to be arranged in a range from a central portion including a center thereof to a peripheral portion including an edge thereof. The auxiliary flow path 330 is formed within the susceptor 210 to be arranged in a part of the surface of the susceptor 210 and to be located above the main flow path 320 while spaced apart from the main flow path 320. The auxiliary flow path 330 may be formed at a required position. FIG. 2 illustrates an example configuration where the auxiliary flow path 330 is formed in a part of the central portion of the mounting table 200.

By way of example, in order to transfer heat of the temperature control medium to all portions in the surface of the susceptor 210, the main flow path 320 is formed, for example, concentrically or in a spiral shape within the susceptor 210 to be arranged over the entire surface of the susceptor 210 including the central portion thereof and the peripheral portion thereof. Desirably, an inlet opening for the temperature control medium is formed at one end of the main flow path 320, and an outlet opening for the temperature control medium is formed at the other end of the main flow path 320.

The auxiliary flow path 330 is formed only in a part of the central portion of the susceptor 210 concentrically or in a spiral shape to transfer heat of the temperature control medium to the part of the central portion of the susceptor 210. Desirably, an inlet opening for the temperature control medium is formed at one end of the auxiliary flow path 330, and an outlet opening for the temperature control medium is formed at the other end of the auxiliary flow path 330.

Here, by way of example, it may be desirable to use a temperature control medium having high insulation resistance. Such a temperature control medium may be, but not limited to, Fluorinert (product name) or Galden (registered trademark) as a fluorine-based solvent.

The temperature control medium circulating unit is configured to supply and circulate the temperature control medium adjusted to have a preset temperature into and through the main flow path 320; allow the temperature control medium to be branched; supply and circulate the branched temperature control medium into and through the auxiliary flow path 330 after adjusting a temperature of the branched temperature control medium to be a temperature higher than or lower than the set temperature.

To elaborate, the temperature control medium circulating unit includes, as illustrated in FIG. 2, a chiller unit 310 configured as a temperature control medium circulator. The chiller unit 310 includes, for example, a temperature controller and a pump, and further includes a discharge opening (OUT) and a return opening (IN) for the temperature control medium. The chiller unit 310 is configured to discharge the temperature control medium from the discharge opening (OUT) after adjusting the temperature of the temperature control medium to be the set temperature (the set temperature of the entire susceptor 210). Further, the chiller unit 310 is also configured to discharge again the temperature control medium returned back to the return opening (IN), after adjusting the temperature of the returned temperature control medium to be the set temperature. The set temperature of the entire susceptor 210 may be set to a desired temperature by the controller 140.

Connected to the discharge opening (OUT) of the chiller unit 310 is a main supply line 322 through which the temperature control medium is supplied into the main flow path 320. Connected to the return opening (IN) of the chiller unit 310 is a main return line 324 through which the temperature control medium is returned back into the chiller unit 310. The inlet opening of the main flow path 320 is connected at a downstream side of the main supply line 322, and the outlet opening of the main flow path 320 is connected at an upstream side of the main return line 324.

An auxiliary supply line 332 is connected with a portion of the main supply line 322 to be branched from the main supply line 322, and the temperature control medium is supplied into the auxiliary flow path 330 through this auxiliary supply line 332. The auxiliary supply line 332 is connected to an inlet opening of the auxiliary flow path 330, and an auxiliary return line 334 is connected to an outlet opening of the auxiliary flow path 330. The main return line 324 is connected at a downstream side of the auxiliary return line 334. Accordingly, the temperature control medium introduced into the auxiliary return line 334 after circulated through the auxiliary flow path 330 is mixed with the temperature control medium circulated through the main flow path 320 at the main return line 324 to be returned back into the chiller unit 310.

The auxiliary supply line 332 is equipped with an auxiliary temperature controller 338 configured to control the temperature of the temperature control medium to be supplied into the auxiliary flow path 330. The auxiliary temperature controller 338 may include either one of a cooler or a heater, or both of them. By adjusting the temperature of the temperature control medium flowing through the auxiliary supply line 332 through the auxiliary temperature controller 338, it is possible to set the temperature of the temperature control medium circulated through the auxiliary flow path 330 to be higher or lower than the set temperature of the temperature control medium circulated through the main flow path 320.

To elaborate, by heating the temperature control medium through the auxiliary temperature controller 338, a temperature of a part of the central portion of the susceptor 210 where the auxiliary flow path 330 is formed can be set to a temperature higher than the set temperature of the entire susceptor 210. Further, by cooling the temperature control medium through the auxiliary temperature controller 338, the temperature of the part of the central portion of the susceptor 210 can be set to a temperature lower than the set temperature of the entire susceptor 210. The temperature set by the auxiliary temperature controller 338 can be controlled to a required temperature by the controller 140.

As described above, it is possible to locally control a temperature of a required part in the central portion of the susceptor 210 to be higher than or lower than the temperature in the entire surface of the susceptor 210 based on the temperature of the temperature control medium adjusted by the chiller unit 310. Thus, controllability of the temperature in the surface of the susceptor 210 can be improved.

Desirably, a cross sectional area of the auxiliary flow path 330 is set to be smaller than a cross sectional area of the main flow path 320. Still desirably, cross sectional areas of the auxiliary supply line 332 and the auxiliary return line 334 are set to be smaller than cross sectional areas of the main supply line 322 and the main return line 324, respectively. With this configuration, a flow rate of the temperature control medium branched from the main supply line 322 into the auxiliary supply line 332 can be reduced, so that it is also possible to reduce a flow rate of the temperature control medium circulated through the auxiliary flow path 330.

In such a case, as the cross sectional area of the auxiliary supply line 332 decreases as compared to the cross sectional area of the main flow path 320, it may be difficult for the temperature control medium to be branched into the auxiliary supply line 332. For this reason, as illustrated in FIG. 2, for example, by providing a pump 336 at the auxiliary supply line 332, the temperature control medium of the main supply line 322 may be forced to be branched into the auxiliary supply line 332.

Here, an operation of the temperature control device 300 shown in FIG. 2 will be explained. If the temperature control medium of which temperature is adjusted to be a set temperature (a set temperature of the entire susceptor 210) by the chiller unit 310 is supplied into the main supply line 322 from the discharge opening (OUT), a part of the temperature control medium is branched into the auxiliary supply line 332. The temperature control medium passing through the main supply line 322 is supplied into and circulated through the main flow path 320, and the temperature control medium passing through the auxiliary supply line 332 is supplied into and circulated through the auxiliary flow path 330.

The temperature of the temperature control medium supplied into the auxiliary flow path 330 is further adjusted by the auxiliary temperature controller 338. For example, by cooling the temperature control medium passing through the auxiliary supply line 332 through the auxiliary temperature controller 338, a temperature of the part of the central portion of the susceptor where the auxiliary flow path 330 is formed can be set to be lower than the temperature of the entire surface of the susceptor. On the contrary, by heating the temperature control medium passing through the auxiliary supply line 332 through the auxiliary temperature controller 338, the temperature of the part of the central portion of the susceptor where the auxiliary flow path 330 is formed can be set to be higher than the temperature of the entire surface of the susceptor. In this way, the temperature in the surface of the mounting table 200 can be adjusted.

The temperature control medium having passed through the main flow path 320 is returned back to the return opening (IN) of the chiller unit 310 via the main return line 324. At this time, the temperature control medium having passed through the auxiliary flow path 330 is flown into the main return line 324 via the auxiliary return line 334, and is mixed with the temperature control medium flowing through the main flow path 320 to be returned to the return opening (IN) of the chiller unit 310.

As stated above, in the temperature control device 300 in accordance with the present example embodiment, the temperature control medium of which temperature is adjusted to be the preset temperature by the chiller unit 310 is circulated through the main flow path 320 formed within the entire surface of the susceptor 210. Accordingly, the temperature of the entire susceptor 210 can be adjusted to the set temperature. Further, the same temperature control medium is branched and circulated through the auxiliary flow path 330 formed in a part of central portion of the susceptor after the temperature of the branched temperature control medium is adjusted. Accordingly, it is possible to locally adjust the temperature of only the part of the central portion of the susceptor where the auxiliary flow path 330 is formed.

With this configuration, it is possible to additionally cool or heat the temperature control medium by a required temperature than the set temperature of the entire susceptor 210 by the single chiller unit 310 to locally control the temperature. Thus, the temperature in the surface of the susceptor can be easily adjusted. Besides, controllability can also be improved as compared to a configuration where flow paths are formed in a part of a central portion of the susceptor and in a part of a peripheral portion thereof, respectively, and temperature control mediums are circulated through the respective flow paths independently.

The temperature control medium supplied into the auxiliary flow path 330 of the susceptor 210 is additionally adjusted to a temperature higher than or lower than the set temperature after branched from the temperature control medium supplied into the main flow path 320, i.e., from the temperature control medium adjusted to the set temperature by the chiller unit 310. Thus, it is possible to perform the temperature adjustment more promptly. Therefore, responsiveness of the temperature control in the surface of the mounting table 200 can be improved.

Further, the temperature control device 300 in accordance with the present example embodiment can control the temperature of the temperature control medium, not a pressure of a heat transfer gas. Thus, even if a power level of a high frequency power for plasma generation is low, it is possible to generate a sufficient difference between a temperature of the portion of the susceptor 210 where the auxiliary flow path 330 is formed and a set temperature of the entire susceptor 210.

Further, a temperature sensor configured to detect a temperature in the surface of the susceptor 210 may be provided at the susceptor 210. By way of example, as illustrated in FIG. 2, a temperature sensor 352 configured to detect a temperature in the surface of the entire susceptor 210 and a temperature sensor 343 configured to detect a temperature in the surface of the portion of the susceptor 210 where the auxiliary flow path 330 is formed may be provided.

In this configuration, temperatures detected by the temperature sensors 352 and 354 may be fed back to the controller 140, and the controller 140 can control a temperature of the temperature control medium by the chiller unit 310 and the auxiliary temperature controller 338 based on the detected temperatures. Further, the temperatures detected by the temperature sensors 352 and 354 may be directly inputted to the chiller unit 310 and the auxiliary temperature controller 338. Thus, the temperature of the temperature control medium may be feedback-controlled by the chiller unit 310 and the auxiliary temperature controller 338 individually.

Although the present example embodiment has been described for the case where the auxiliary flow path 330 is formed in a part of the central portion of the mounting table 200, the example embodiment may not be limited thereto. By way of example, the auxiliary flow path may be formed only in a part of the peripheral portion of the mounting table 200 (susceptor 210).

Modification Example of the Present Example Embodiment

Figure 3:
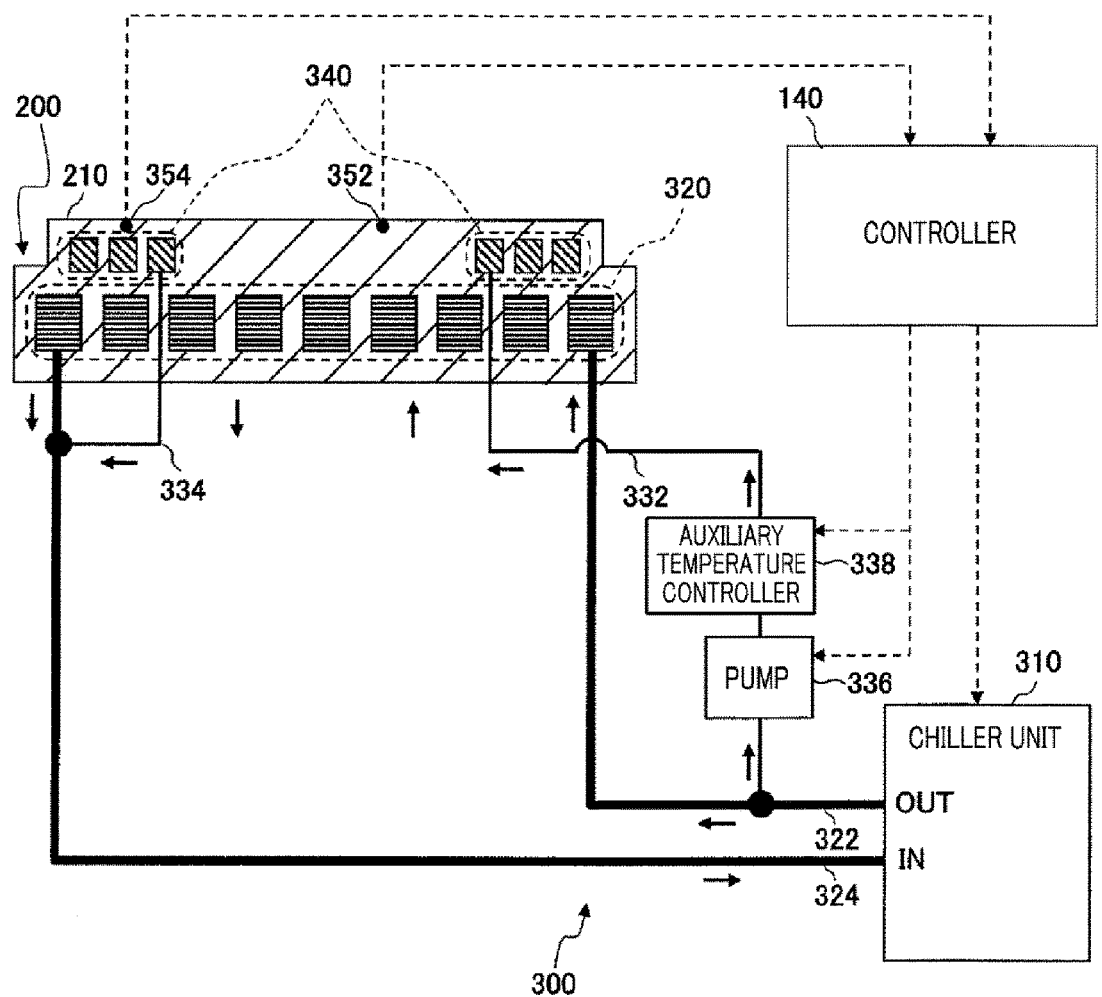
FIG. 3 is a diagram for describing a configuration of a temperature control device of a mounting table in accordance with a modification example of the example embodiment.

Here, as a temperature control device 300 in accordance with a modification example of the present example embodiment, a configuration in which an auxiliary flow path is formed only in a part of a peripheral portion of the mounting table 200 (susceptor 210) will be explained with reference to accompanying drawings. FIG. 3 is a diagram illustrating a detailed configuration example of the temperature control device 300 in accordance with the modification example.

In the temperature control device 300 shown in FIG. 3, an auxiliary flow path 340 is formed only in a part of a peripheral portion of a mounting table 200 (susceptor 210). By way of non-limiting example, the auxiliary flow path 340 is formed concentrically or in a spiral shape only in that part of the peripheral portion of the mounting table 200 (susceptor 210) in order to transfer heat of a temperature control medium thereto. An inlet opening for the temperature control medium is formed at one end of the auxiliary flow path 340, and an outlet opening for the temperature control medium is formed at the other end of the auxiliary flow path 340.

In this configuration, the auxiliary supply line 332 is connected to the inlet opening of the auxiliary flow path 340, and the auxiliary return line 334 is connected to the outlet opening of the auxiliary flow path 340. The other line configuration is the same as that shown in FIG. 2, and detailed description thereof will be omitted.

With this configuration, by circulating the temperature control medium, which is adjusted to have a certain temperature by a chiller unit 310, through the main flow path 320 formed within the susceptor 210 to be arranged over the entire surface thereof, a temperature of the entire susceptor 210 is adjusted to a preset temperature. Further, by allowing the same temperature control medium to be branched, adjusting a temperature of the branched temperature control medium and then circulating this adjusted temperature control medium through the auxiliary flow path 340 formed in the certain part of the peripheral portion of the susceptor 210, it is possible to locally adjust the temperature of only that part of the peripheral portion to be a temperature higher than or lower than the preset temperature.

Further, the temperature control device 300 in accordance with the present example embodiment may not be limited to the configuration examples depicted in FIG. 2 and FIG. 3. Auxiliary flow paths may be independently formed in a part of a central portion of the mounting table 200 (susceptor 210) and in a part of a peripheral portion thereof. In such a configuration, a first auxiliary supply line branched from a main supply line and configured to supply the temperature control medium into one of the auxiliary flow paths may be provided, and a second auxiliary supply line further branched from the first auxiliary supply line and configured to supply the temperature control medium to the other one of the auxiliary flow paths may be provided. An auxiliary temperature controller may be provided at either one of the first and second auxiliary supply lines or at each of them.

With this configuration, it is possible to allow the temperature control medium, which flows through the main supply line after discharged from the chiller unit 310, to be branched into and circulated through the auxiliary flow path formed in the part of the central portion thereof and through the auxiliary flow path formed in the part of the peripheral portion thereof via the first auxiliary supply line and the second auxiliary supply line, respectively. At this time, by providing an auxiliary temperature controller at either one of the first and second auxiliary supply lines, a temperature of the temperature control medium circulated through either one of the auxiliary flow path in the part of the central portion and the auxiliary flow path in the part of the peripheral portion can be adjusted by the auxiliary temperature controller.

Further, an auxiliary temperature controller may be provide at each of the first auxiliary supply line and the second auxiliary supply line. With this configuration, it is possible to independently adjust a temperature of the temperature control medium circulated through the auxiliary flow path in the part of the central portion and a temperature of the temperature control medium circulated through the auxiliary flow path in the part of the peripheral portion.

Another Modification Example of the Present Example Embodiment

Figure 4:
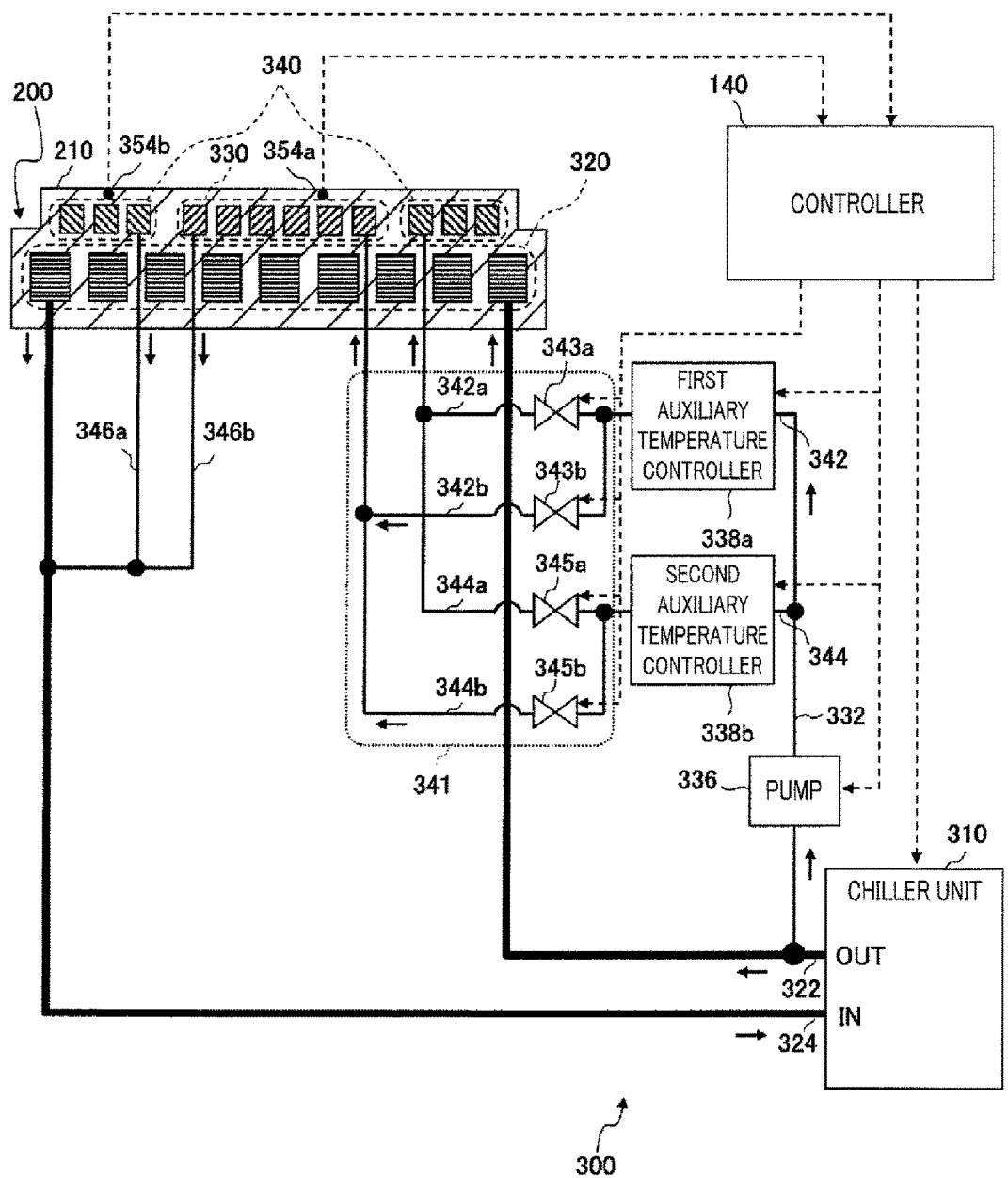
FIG. 4 is a diagram for describing a configuration of a temperature control device of a mounting table in accordance with another modification example of the example embodiment.

Now, as a temperature control device 300 in accordance with another modification example of the present example embodiment, a configuration example in which auxiliary flow paths are independently formed in a part of a central portion of a mounting table 200 (susceptor 210) and in a part of a peripheral portion thereof will be explained. FIG. 4 is a diagram illustrating a detailed configuration example of the temperature control device 300 in accordance with this modification example.

In the temperature control device 300 depicted in FIG. 4, a central auxiliary flow path 330 is formed in a part of the central portion of the susceptor 210, and a peripheral auxiliary flow path 340 is formed in a part of the peripheral portion of the susceptor 210 separately from the central auxiliary flow path 330.

As a specific example of a line configuration of this temperature control device 300, a first auxiliary supply line 342 and a second auxiliary supply line 344 branched from a main supply line 322 are formed. A first auxiliary temperature controller 338*a* and a second auxiliary temperature controller 338*b* are provided at the first auxiliary supply line 342 and the second auxiliary supply line 344, respectively. Each of the first and second auxiliary temperature controllers 338*a* and 338*b* may be configured as a cooler that cools a temperature control medium, or a heater that heats the temperature control medium. In this modification example, the first auxiliary temperature controller 338*a* is configured as a cooler, whereas the second temperature controller 338*b* is configured as a heater.

The first and second auxiliary supply lines 342 and 344 are connected to a switching unit 341 that connects the first and second auxiliary supply lines 342 and 344 to the auxiliary flow paths 330 and 340, respectively. The switching unit 341 is configured to selectively switch the temperature control medium from the first auxiliary supply line 342 and the temperature control medium from the second auxiliary supply line 344 and supply the selected temperature control medium into either one of the auxiliary flow paths 330 and 340.

The switching unit 341 may be configured as illustrated in FIG. 4, for example. That is, the first auxiliary supply line 342 is branched into a peripheral supply line 342*a* and a central supply line 342*b*, which are connected to inlet openings of the auxiliary flow paths 330 and 340, respectively. Likewise, the second auxiliary supply line 344 is also branched into a peripheral supply line 344*a* and a central supply line 344*b*, which are connected to the inlet openings of the auxiliary flow paths 330 and 340, respectively.

Further, opening/closing valves 343*a* and 343*b* are provided at the peripheral supply line 342*a* and the central supply line 342*b*, respectively, and opening/closing valves 345*a* and 345*b* are provided at the peripheral supply line 344*a* and the central supply line 344*b*, respectively. Opening/closing operations of the opening/closing valves 343*a*, 343*b*, 345*a* and 345*b* are controlled by the controller 140.

By using the switching unit 341, it is possible to selectively switch the temperature control medium adjusted through the first auxiliary temperature controller 338*a* and the temperature control medium adjusted through the second auxiliary temperature controller 338*b* to supply them into the auxiliary flow paths 330 and 340. By way of example, by closing the opening/closing valves 343*a* and 345*b* while opening the opening/closing valve 343*b* and 345*a*, the temperature control medium cooled by the first auxiliary temperature controller 338*a* (cooler) may be supplied into the central auxiliary flow path 330, and the temperature control medium heated by the second auxiliary temperature controller 338*b* (heater) may be supplied into the peripheral auxiliary flow path 340.

On the contrary, by closing the opening/closing valves 343*b* and 345*a* while opening the opening/closing valves 343*a* and 345*b*, the temperature control medium cooled by the first auxiliary temperature controller 338*a* (cooler) may be supplied into the peripheral auxiliary flow path 340, and the temperature control medium heated by the second auxiliary temperature controller 338*b* (heater) may be supplied into the central auxiliary flow path 330. Further, the configuration of the switching unit 341 may not be limited to the example depicted in FIG. 4.

As stated above, by supplying the temperature control medium adjusted by the first auxiliary temperature controller 338*a* and the temperature control medium adjusted by the second auxiliary temperature controller 338*b* into the respective auxiliary flow paths 330 and 340 while selectively switching them through the switching unit, it may be possible to locally and dynamically adjust a temperature of each of the central portion and the peripheral portion of the mounting table 200, where the auxiliary flow paths 330 and 340 are formed, respectively, to be a temperature higher than a set temperature or a temperature lower than the set temperature based on the set temperature of the temperature control medium controlled by the chiller unit 310. Further, the first and second auxiliary temperature controllers 338*a* and 338*b* may not be both provided, but either one of them may be provided.

In the temperature control device 300 shown in FIG. 4, a temperature sensor 354*a* may be provided at the portion where the central auxiliary flow path 330 is formed, and a temperature sensor 354*b* may be provided at the portion where the peripheral auxiliary flow path 340 is formed. Temperatures detected by these temperature sensors may be fed back to the controller 140.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

By way of example, although the above example embodiment has been described for the case that the substrate processing apparatus is configured as an apparatus of a type that excites plasma by applying dual high frequency powers of different frequencies only to a lower electrode, the example embodiment may not be limited thereto. For example, the example embodiment may also be applicable to a substrate processing apparatus of a type that excites plasma by applying a single frequency power only to a lower electrode, a substrate processing apparatus of a type that excites plasma by applying dual frequency powers of different frequencies to an upper electrode and a lower electrode, respectively, etc.

Further, the example embodiment may not be limited to the capacitively coupled parallel plate type substrate processing apparatus, but may be applicable to, for example, an inductively coupled plasma (ICP) processing apparatus, or the like. Besides, the present example embodiment may also be applicable to various other types of substrate processing apparatuses, such as a sputtering apparatus, a heat treating apparatus, a film forming apparatus, which are configured to perform processes on a substrate while adjusting a temperature of a mounting table.

INDUSTRIAL APPLICABILITY

The example embodiment may be applicable to a substrate processing apparatus and a mounting table temperature control device configured to control a temperature of a mounting table for mounting thereon a processing target substrate such as a semiconductor wafer, a solar cell substrate or a liquid crystal substrate.

EXPLANATION OF CODES

100: Substrate processing apparatus
102: Processing chamber
104: Gas exhaust opening
106: Gas exhaust device
107: Loading/unloading opening
108: Gate valve
120: Upper electrode
121: Opening/closing valve
122: Processing gas supply unit
123: Processing gas supply line
124: Electrode plate
125: Gas holes
126: Electrode supporting member
127: Buffer room
128: Gas inlet opening
130: Power supply device
132: First high frequency power supply
133: First matching device
134: Second high frequency power supply
135: Second matching device
140: Controller
142: Manipulation unit
144: Storage unit
200: Mounting table
202: Cylindrical member
204: Cylindrical holding member
206: Focus ring
210: Susceptor
300: Temperature controller
310: Chiller unit
320: Main flow path
322: Main supply line
324: Main return line
330: Auxiliary flow path (central auxiliary flow path)
340: Auxiliary flow path (peripheral auxiliary flow path)
332: Auxiliary supply line
334: Auxiliary return line
336: Pump
338: Auxiliary temperature controller
342: First auxiliary supply line
344: Second auxiliary supply line
338a: First auxiliary temperature controller
338b: Second auxiliary temperature controller
342a: Peripheral supply line
342b: Central supply line
343a, 343b: Opening/closing valves
344a: Peripheral supply line
344b: Central supply line
345a, 345b: Opening/closing valves
352: Temperature sensor
354 (354a, 354b): Temperature sensor
W: Wafer

I claim:

1. A mounting table temperature control device that controls a temperature of a mounting table, the device comprising:
   a main flow path formed within the mounting table to be arranged over an entire surface thereof;
   at least one auxiliary flow path formed within the mounting table to be arranged in a part of the surface of the mounting table;
   a main supply line configured to supply a temperature control medium discharged from a temperature control medium circulator into the main flow path; and
   an auxiliary supply line branched from the main supply line and configured to supply the temperature control medium into the at least one auxiliary flow path,
   wherein the mounting table temperature control device is configured to supply and circulate the temperature control medium adjusted to have a set temperature into and through the main flow path, allow the temperature control medium to be branched, and supply and circulate the branched temperature control medium into and through the at least one auxiliary flow path after adjusting a temperature of the branched temperature control medium to a temperature higher than or lower than the set temperature,
   a cross sectional area of the at least one auxiliary flow path is set to be smaller than a cross sectional area of the main flow path, and a cross sectional area of the auxiliary supply line is set to be smaller than a cross sectional area of the main supply line, the mounting table temperature control device further comprising:
   a first pump provided at the temperature control medium circulator to supply and circulate the temperature control medium, and
   a second pump provided at the auxiliary supply line such that the temperature control medium of the main supply line is forced to be branched into the auxiliary supply line.

2. The mounting table temperature control device of claim 1, further comprising:
   the temperature control medium circulator, having a discharge opening and a return opening for the temperature control medium, configured to discharge the temperature control medium through the discharge opening after adjusting a temperature of the temperature control medium to the set temperature and discharge again the temperature control medium returned back to the return opening after adjusting a temperature of the returned temperature control medium to the set temperature; and
   an auxiliary temperature controller that is provided at the auxiliary supply line and is configured to adjust a temperature of the temperature control medium branched into the auxiliary supply line to a temperature higher than or lower than the set temperature before the branched temperature control medium is supplied into the at least one auxiliary flow path.

3. The mounting table temperature control device of claim 1,
   wherein the at least one auxiliary flow path is formed either in a part of a central portion of the mounting table or in a part of a peripheral portion of the mounting table.

4. The mounting table temperature control device of claim 1, further comprising:
   the temperature control medium circulator, having a discharge opening and a return opening for the temperature control medium, configured to discharge the temperature control medium through the discharge opening after adjusting a temperature of the temperature control medium to be the set temperature and discharge again the temperature control medium returned back to the return opening after adjusting a temperature of the returned temperature control medium to be the set temperature;

a switching unit configured to connect the first auxiliary supply line and the second auxiliary supply line to the auxiliary flow paths, respectively, and supply the temperature control medium from the first auxiliary supply line and the temperature control medium from the second auxiliary supply line into the auxiliary flow paths, respectively, while selectively switching the temperature control medium from the first auxiliary supply line and the temperature control medium from the second auxiliary supply line; and an auxiliary temperature controller that is provided at either one or each of the first auxiliary supply line and the second auxiliary supply line, and is configured to adjust a temperature of the temperature control medium to be a temperature higher than or lower than the set temperature before the temperature control medium is supplied into each auxiliary flow path, wherein the auxiliary supply line includes a first auxiliary supply line and a second auxiliary supply line, the at least one auxiliary flow path is plural in number, and the auxiliary flow paths are formed in each of a part of a central portion of the mounting table and a part of a peripheral portion of the mounting table.

5. A substrate processing apparatus that performs a preset process on a substrate mounted on a mounting table, the substrate processing apparatus comprising:

a mounting table temperature control device configured to control a temperature of the mounting table, wherein the mounting table temperature control device comprises:

a main flow path formed within the mounting table to be arranged over an entire surface thereof;

an auxiliary flow path formed within the mounting table to be arranged in a part of the surface of the mounting table;

a main supply line configured to supply a temperature control medium discharged from a temperature control medium circulator into the main flow path; and an auxiliary supply line branched from the main supply line and configured to supply the temperature control medium into the at least one auxiliary flow path, wherein the mounting table temperature control device is configured to supply and circulate the temperature control medium adjusted to have a set temperature into and through the main flow path, allow the temperature control medium to be branched, and supply and circulate the branched temperature control medium into and through the auxiliary flow path after adjusting a temperature of the branched temperature control medium to a temperature higher than or lower than the set temperature, a cross sectional area of the at least one auxiliary flow path is set to be smaller than a cross sectional area of the main flow path, and a cross sectional area of the auxiliary supply line is set to be smaller than a cross sectional area of the main supply line, the mounting table temperature control device further comprising:

a first pump provided at the temperature control medium circulator to supply and circulate the temperature control medium, and a second pump provided at the auxiliary supply line such that the temperature control medium of the main supply line is forced to be branched into the auxiliary supply line.

* * * * *